(12) United States Patent
Takeshima (10) Patent No.: US 8,441,130 B2
(45) Date of Patent: May 14, 2013

(54) POWER SUPPLY INTERCONNECT STRUCTURE OF SEMICONDUCTOR INTEGRATED CIRCUIT

(75) Inventor: Hideaki Takeshima, Kyoto (JP)

(73) Assignee: Panasonic Corporation, Osaka (JP)

( * ) Notice: Subject to any disclaimer, the term of this patent is extended or adjusted under 35 U.S.C. 154(b) by 89 days.

(21) Appl. No.: 13/177,335

(22) Filed: Jul. 6, 2011

(65) Prior Publication Data

US 2011/0260335 A1 Oct. 27, 2011

Related U.S. Application Data

(63) Continuation of application No. PCT/JP2009/004119, filed on Aug. 26, 2009.

(30) Foreign Application Priority Data

Jan. 20, 2009 (JP) .................................. 2009-009972

(51) Int. Cl.
*H01L 23/48* (2006.01)
*H01L 23/52* (2006.01)
*H01L 29/40* (2006.01)

(52) U.S. Cl.
USPC .................. 257/774; 257/750; 257/E23.145; 438/622

(58) Field of Classification Search .................. 257/750, 257/774, E23.145; 438/622
See application file for complete search history.

(56) References Cited

U.S. PATENT DOCUMENTS

| | | | |
|---|---|---|---|
| 5,891,799 A | 4/1999 | Tsui | |
| 6,225,211 B1* | 5/2001 | Tsui | 438/624 |
| 6,555,911 B1 | 4/2003 | Matsubara et al. | |
| 2003/0051218 A1* | 3/2003 | Kumagai | 716/8 |
| 2006/0097401 A1 | 5/2006 | Kumagai | |

FOREIGN PATENT DOCUMENTS

| | | |
|---|---|---|
| JP | 05-335484 | 12/1993 |
| JP | 2001-156168 | 6/2001 |
| JP | 2003-086681 | 3/2003 |

* cited by examiner

*Primary Examiner* — Jarrett Stark
*Assistant Examiner* — Nicholas Tobergte
(74) *Attorney, Agent, or Firm* — McDermott Will & Emery LLP (57) ABSTRACT

A power supply interconnect structure of a semiconductor integrated circuit includes a single borderless stack via electrically connecting power supply interconnects of two different interconnect layers to form a connecting portion of the interconnects, and a multi-stack via functioning as another connecting portion of the interconnects, which electrically connect the power supply interconnects, and having a wide pad portion. The single borderless stack via is located in an interconnect region with high signal interconnect density. The multi-stack via is located in an interconnect region with low signal interconnect density. This increases interconnection efficiency in the region with the high signal interconnect density to improve interconnection characteristics. This enables reduction in an area of a chip and increases compatibility to an EDA tool, thereby improving IR-DROP characteristics.

17 Claims, 11 Drawing Sheets

POWER SUPPLY INTERCONNECT STRUCTURE OF SEMICONDUCTOR INTEGRATED CIRCUIT

CROSS-REFERENCE TO RELATED APPLICATION

This is a continuation of PCT International Application PCT/JP2009/004119 filed on Aug. 26, 2009, which claims priority to Japanese Patent Application No. 2009-009972 filed on Jan. 20, 2009. The disclosures of these applications including the specifications, the drawings, and the claims are hereby incorporated by reference in their entirety.

BACKGROUND

The present disclosure relates to power supply interconnect structures of semiconductor integrated circuits in which power supply interconnects located in different interconnect layers are electrically connected by vias.

Conventionally, in a semiconductor integrated circuit, a power supply interconnect structure using a multi-stack via is known as a structure in which two power supply interconnects located in two different interconnect layers are electrically connected by a via. The conventional power supply interconnect structure will be described with reference to FIG. 11.

Figure 11:
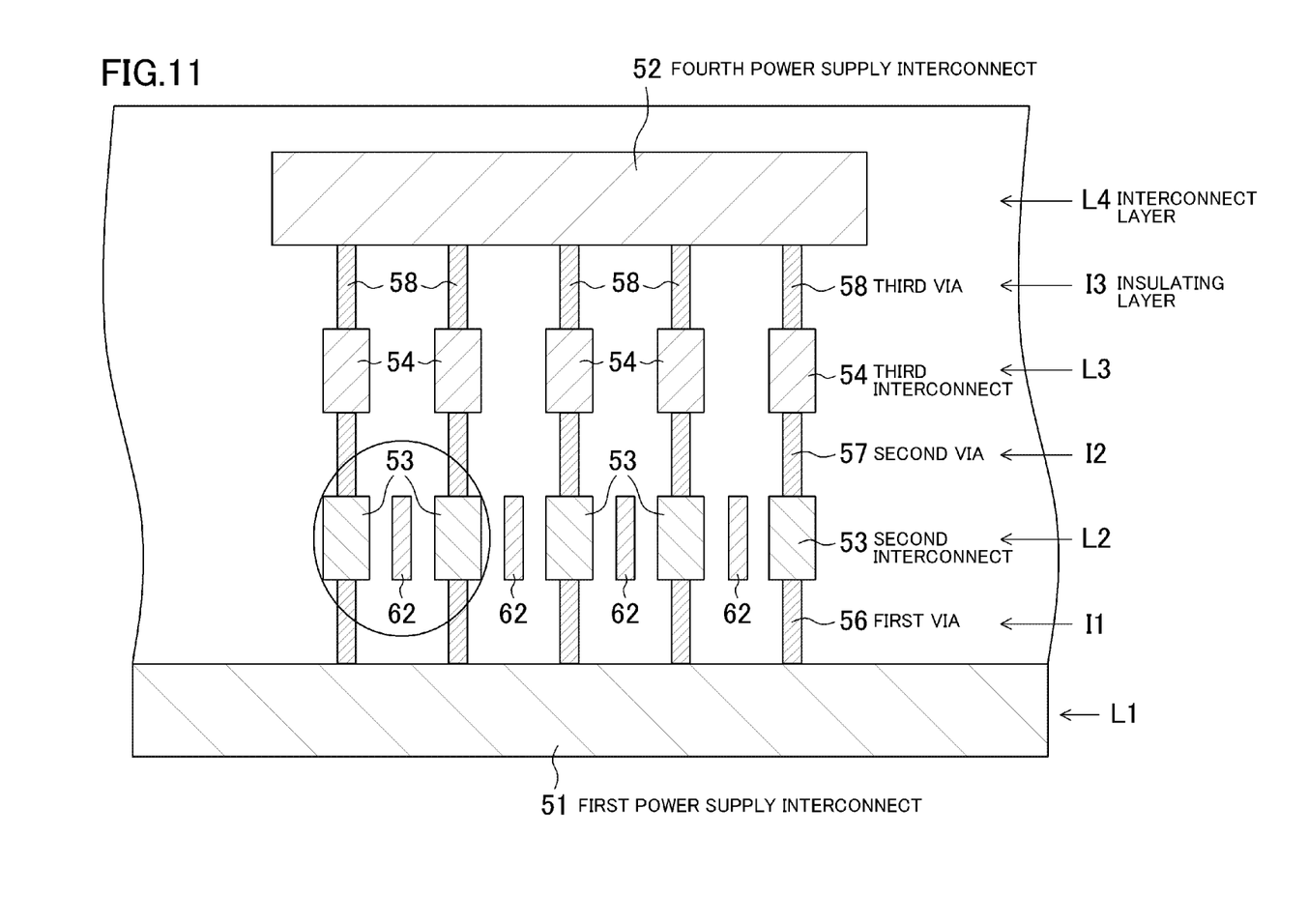
FIG. 11 is a cross-sectional view of a main part of a power supply interconnect structure of a conventional semiconductor integrated circuit.
Figure 13:
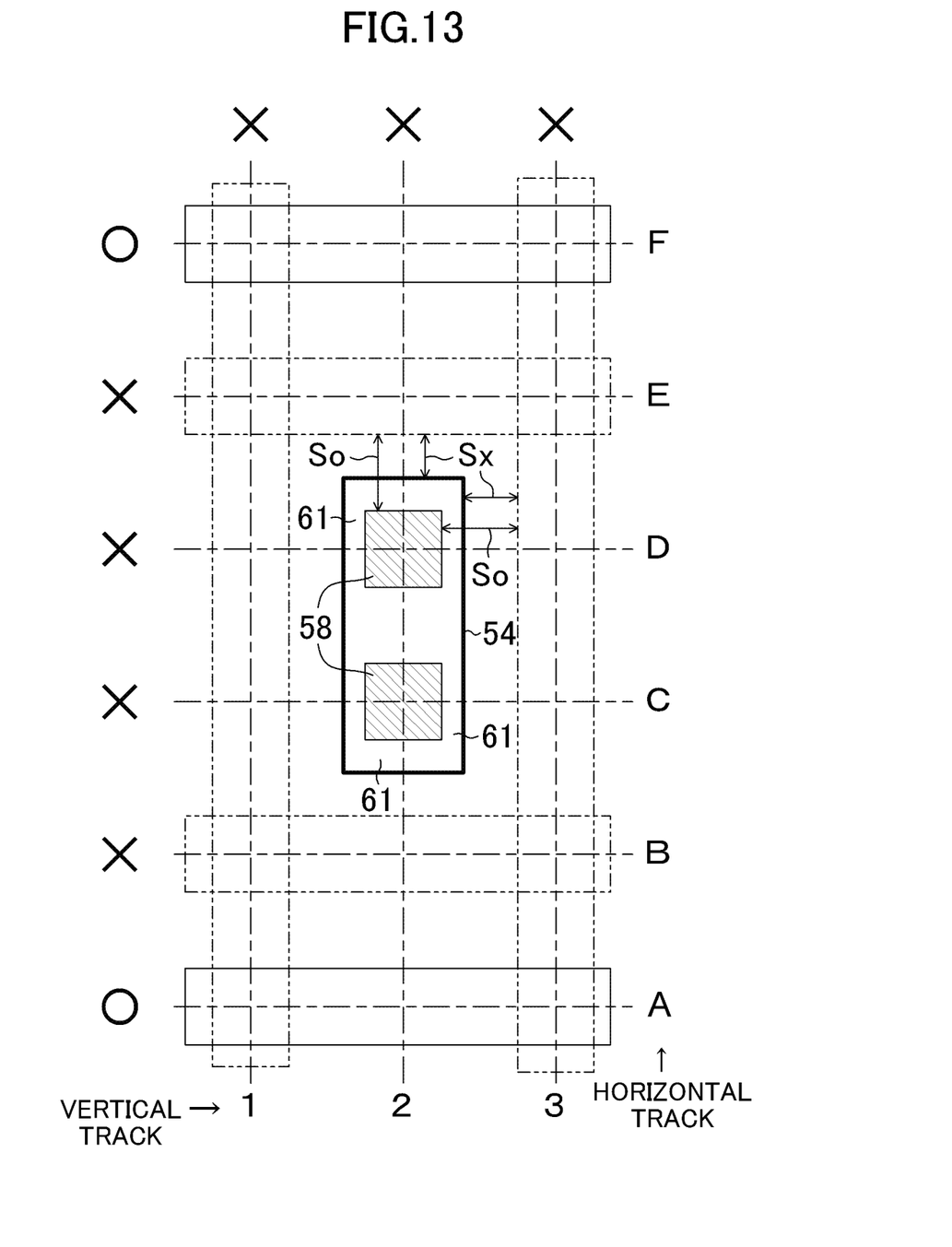
FIG. 13 is a top view of the power supply interconnect structure.

FIG. 11 is a cross-sectional view of an LSI interconnect layer, and FIG. 13 is a top view of the LSI interconnect layer. In these figures, L1-L4 denote first to fourth interconnect layers. Reference character 51 denotes a first power supply interconnect located in the first interconnect layer L1, reference character 52 denotes a fourth power supply interconnect located in the fourth interconnect layer L4. When connecting the first power supply interconnect 51 to the fourth power supply interconnect 52 as a single power supply interconnect, the second interconnect 53 and the third interconnect 54 for connecting the power supply interconnects 51 and 52 in the second and third interconnect layers L2 and L3. A first to third vias 56, 57, and 58 are located in three insulating layers I1-I3. The second and third interconnects 53 and 54 and the first to third vias 56-58 have the forms shown in the top view of FIG. 13. The vias 56-58 are multiple vias (double vias in the figure) in which two vias are closely arranged in a vertical direction in FIG. 13. The interconnects 53 and 54 connected to the multiple vias are widely formed in vertical and horizontal directions to include the double vias inside when viewed from the top.

As can be seen from FIG. 11, the first via 56, the second interconnect 53, the second via 57, the third interconnect 54, and the third via 58 in a single vertical line are stacked to form a single multi-stack via in the same vertical line. Using this multi-stack via as a single unit, five units are formed in the figure. There units connect the first power supply interconnect 51 to the fourth power supply interconnect 52, thereby forming an electrically connected single power supply interconnect.

Furthermore, Japanese Patent Publication No. 2003-86681 teaches calculating the amount of a current flowing between the first and second power supply interconnects 51 and 52, calculating the minimum number of necessary units from the amount of the current, and cutting unnecessary vias to increase interconnect resources. As exemplified by FIG. 11, in Japanese Patent Publication No. 2003-86681, a signal interconnect 62 of the second interconnect layer L2 is located between each two of the five units. This structure increases interconnection efficiency to improve interconnection characteristics.

Different from the above-described power supply interconnect structure, borderless vias have been developed as an interconnect structure of signal interconnects as shown in SEMI Japan, Text Book of Semiconductor Process, pp. 362-363. Like the multiple via shown in FIG. 13, the borderless vias do not have pad portions, which are excessive wide interconnect regions, and are the mainstream of a design for manufacture (DFM). With the development of manufacturing processes of semiconductors, vias and interconnects can be accurately formed in predetermined positions. Thus, a borderless vias is set so that the horizontal and vertical lengths are substantially equal to the horizontal and vertical lengths of an interconnect to which the borderless via is connected.

SUMMARY

In a power supply interconnect structure of a semiconductor integrated circuit, a large number of multi-stack vias are located to address IR-DROP and electromigration (hereinafter referred to as EM) to reduce voltage drop before reaching a target cell and to prevent disconnection at vias.

However, when considering highly integrated design, which is a point of view different from solution to IR-DROP and EM, the multi-stack via may be insufficient to maximize or optimize interconnection efficiency around the vias. This will be described in detail with reference to FIG. 12.

Figure 12:
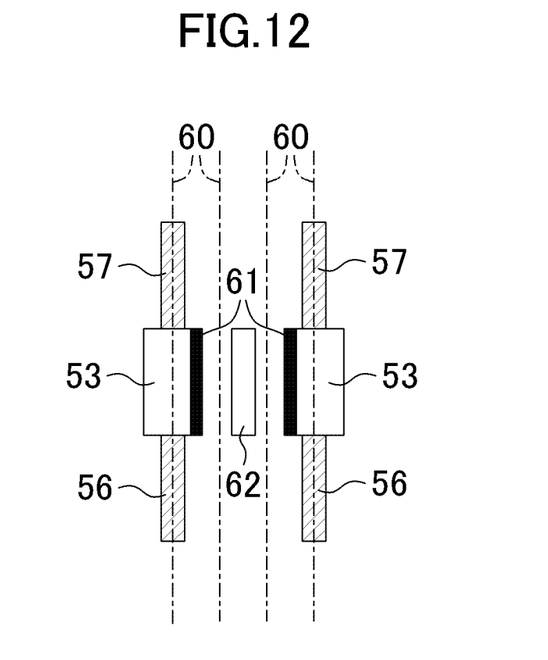
FIG. 12 is an enlarged view of a circled portion in the power supply interconnect structure of FIG. 11.

FIG. 12 is a partial enlarged view of the multi-stack via and the interconnect in the region circled in FIG. 11. In the figure, reference character 60 denotes an interconnect track. The figure shows four interconnect tracks 60. Although two interconnect track 60 are positioned between multi-stack vias, only a single interconnect 62 can pass between the multi-stack vias to comply a separation rule equivalent to an interconnect width, since projecting wide pad portions 61 and 61 exist in the interconnect portion.

This is significant from the top view of FIG. 13. In the figure, when using six horizontal tracks and three vertical tracks, each separation width to the closest horizontal and vertical interconnect tracks is originally a distance So to the vias 58 near multiple (double in the figure) vias. Due to the existence of the pad portion 61 of the interconnect 54, the separation width is the distance Sx which is shorter than the distance So by the length of the pad portion. This disables interconnection to tracks 1 and 3 in a vertical track, and interconnection to tracks B and E in a horizontal track, which are originally possible. As a result, interconnect resources available for a signal interconnect are restricted to zero in the vertical direction and two in the horizontal direction, which are originally two in the vertical direction and four in the horizontal direction.

The present inventors focused on borderless vias which are employed for the signal interconnect as a power supply interconnect structure of a semiconductor integrated circuit, and studied using a single via for power supply interconnects and using a stack borderless via. In the power supply interconnect structure having the single borderless stack via, since there is no pad portion included in a multi-stack via, interconnection efficiency increases to improve interconnection characteristics, while solution to IR-DROP and EM are concerns. With respect to IR-DROP, a conventional multi-stack via structure shown in FIG. 4B has a great parasitic resistance, since power supply interconnect length to the target cell 40 is long. On the other hand, single borderless stack vias shown in FIG. 4A have shorter power supply interconnect length to the target cell 40, since the single borderless stack vias are scattered with larger via-to-via spacing than those of FIG. 4B and a single borderless stack vias is located near the target cell 40. Therefore, IR-DROP can be reduced as compared to a multi-stack via structure. With regard to the EM limited at a via portion, single vias and multiple vias have the same EM characteristics when the numbers of the single vias and the multiple vias are the same each other. Therefore, the present inventors found that interconnection efficiency increases to improve interconnection characteristics while reliably providing solution to IR-DROP and EM, even when a single borderless stack via structure is employed as a power supply interconnect structure.

From the above studies, it is an objective of the present disclosure to reliably provide solution to IR-DROP and EM and to increase interconnection efficiency to improve interconnection characteristics by employing a single borderless stack via structure for connecting power supply interconnects of different interconnect layers as a power supply interconnect structure of a semiconductor integrated circuit.

Specifically, a power supply interconnect structure of a semiconductor integrated circuit according to the present disclosure includes power supply interconnects located in two different interconnect layers with at least one single intermediate interconnect layer interposed therebetween; and a single borderless stack via configured to electrically connect the power supply interconnects located in the two interconnect layers to form a connecting portion of the interconnects.

In the power supply interconnect structure of the semiconductor integrated circuit according to the present disclosure, the single borderless stack via forming the connecting portion of the interconnects includes single vias located in respective two or more insulating layers located between the two interconnect layers, and an interconnect located in each of the at least one intermediate interconnect layer, and having a same cross-sectional shape as the single vias of the insulating layers. The single vias of the insulating layers and the interconnect of the at least one intermediate interconnect layer are alternately layered in a same vertical line and electrically connected to form a unit.

In the power supply interconnect structure of the semiconductor integrated circuit according to the present disclosure, the unit of the single borderless stack via includes single vias located in respective three insulating layers, and interconnects located in respective two intermediate interconnect layers interposed between the three insulating layers.

In the power supply interconnect structure of the semiconductor integrated circuit according to the present disclosure, multiples ones of the unit of the single borderless stack via are formed. Distances between the units are equal.

In the power supply interconnect structure of the semiconductor integrated circuit according to the present disclosure, multiple ones of the unit of the single borderless stack via are formed. Distances between the units are equal and unequal.

In the power supply interconnect structure of the semiconductor integrated circuit according to the present disclosure, multiple ones of the unit of the single borderless stack via are formed. A first signal interconnect is located in a region between two adjacent ones of the units.

In the power supply interconnect structure of the semiconductor integrated circuit according to the present disclosure, a distance between the single borderless stack via and the first signal interconnect is equal to a distance between the first signal interconnect and a second signal interconnect adjacent to the first signal interconnect.

The power supply interconnect structure of the semiconductor integrated circuit according to the present disclosure, further includes the single borderless stack via forming the connecting portion of the interconnects; and a multi-stack via configured to electrically connect the power supply interconnects located in the two interconnect layers to form another connecting portion of the interconnects.

In the power supply interconnect structure of the semiconductor integrated circuit according to the present disclosure, the multi-stack via includes a plurality of vias located in respective two or more insulating layers located between the two interconnect layers, and an interconnect located in each of the at least one intermediate interconnect layer and having a pad portion to include the plurality of vias in the two or more insulating layers inside when viewed from above. The plurality of vias of the insulating layers and the interconnect of the at least one intermediate interconnect layer are alternately layered in a same vertical line and electrically connected.

In the power supply interconnect structure of the semiconductor integrated circuit according to the present disclosure, the single borderless stack via forming the connecting portion of the interconnects is located in a signal interconnect region. The multi-stack via forming the other connecting portion of the interconnects is located in a non-interconnect region to which a signal is not interconnected.

In the power supply interconnect structure of the semiconductor integrated circuit according to the present disclosure, the multi-stack via forming the other connecting portion of the interconnects is located in a region of the signal interconnect region having predetermined signal interconnect density. The single borderless stack via forming the connecting portion of the interconnects is located in an interconnect region of the signal interconnect region, which has signal interconnect density higher than the predetermined density.

In the power supply interconnect structure of the semiconductor integrated circuit according to the present disclosure, multiple ones of the single borderless stack via are located in a plurality of places. A distance between the multiple ones of the single borderless stack via is longer than a distance between the plurality of vias in a same insulating layer of the multi-stack via.

As described above, in the present disclosure, the power supply interconnects of the different interconnect layers are electrically connected by the single borderless stack via. Thus, the structure provides higher interconnection efficiency than a conventional multi-stack via having a wide pad portion, thereby improving interconnection characteristics. As a result, a chip area can be effectively reduced, and IR-DROP and EM characteristics can be well maintained or improved.

In a conventional technique, it was difficult to place a signal interconnect around a multi-stack via on an interconnect track defined by an EDA tool. By contrast, a signal interconnect around a single borderless stack via can be well placed on an interconnect track to provide excellent compatibility to an EDA tool.

In particular, the structure of the present disclosure includes the two types of the single borderless stack via and the multi-stack via as connecting portions of connecting the two power supply interconnects. This effectively reduces an increase in combined resistance values of the entire power supply interconnect to improve the yield, even when via open faults occur.

As described above, in the power supply interconnect structure of the semiconductor integrated circuit according to the present disclosure, the single borderless stack via structure is employed. This increases interconnection efficiency to improve interconnection characteristics, reduces a chip area, and well maintains or improves IR-DROP and EM characteristics. In addition, compatibility to the EDA tool increases to reduce turn around time (TAT).

In particular, the structure according to the present disclosure also includes the multi-stack via as a connecting portion of interconnects. This effectively reduces an increase in the combined resistance values of the entire power supply interconnect when via open faults occur to improve the yield.

DETAILED DESCRIPTION

First Embodiment

A first embodiment of the present disclosure will be described hereinafter with reference to the drawings.

Figure 1:
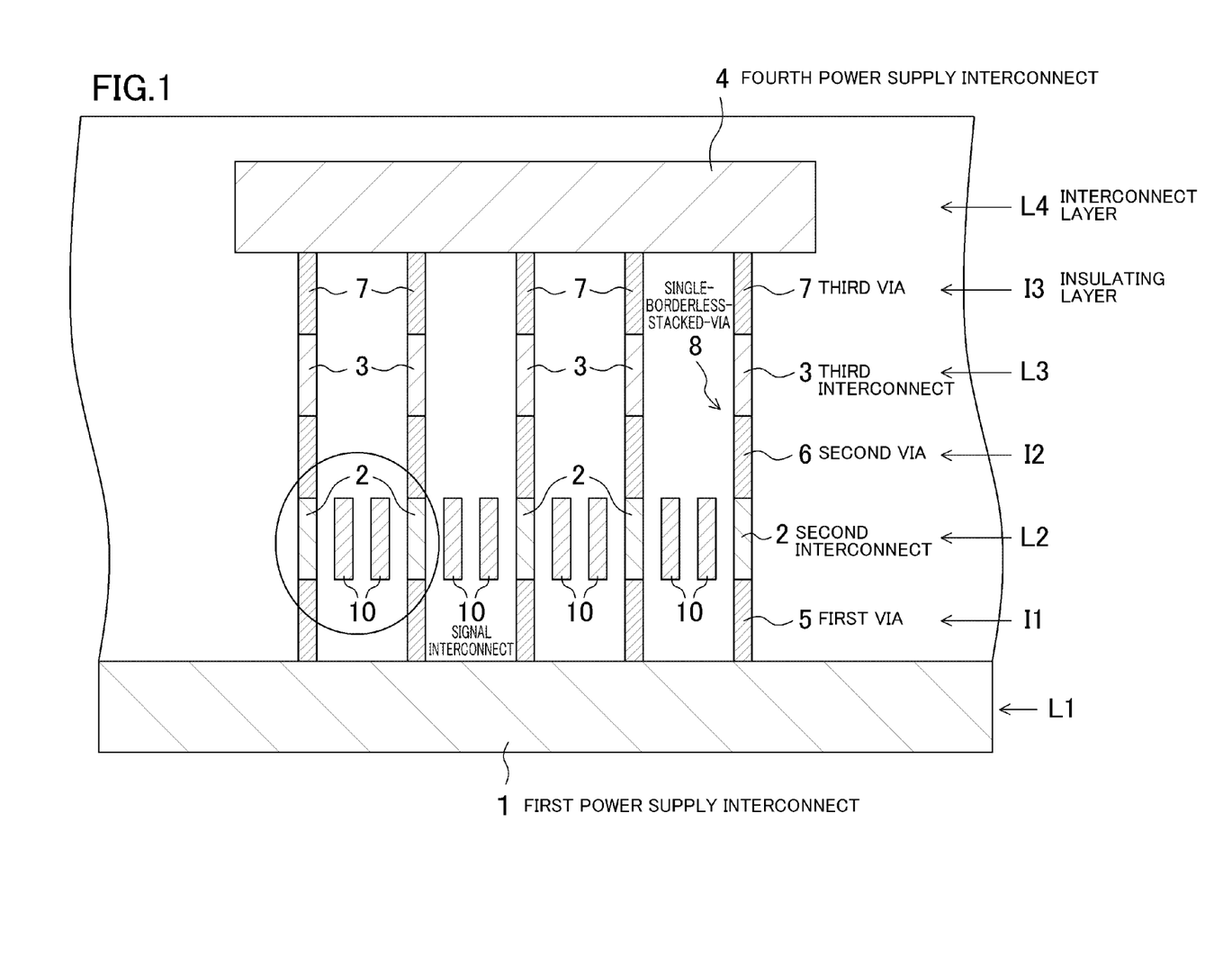
FIG. 1 is a cross-sectional view of a main part of a power supply interconnect structure of a semiconductor integrated circuit according to a first embodiment of the present disclosure.
Figure 2:
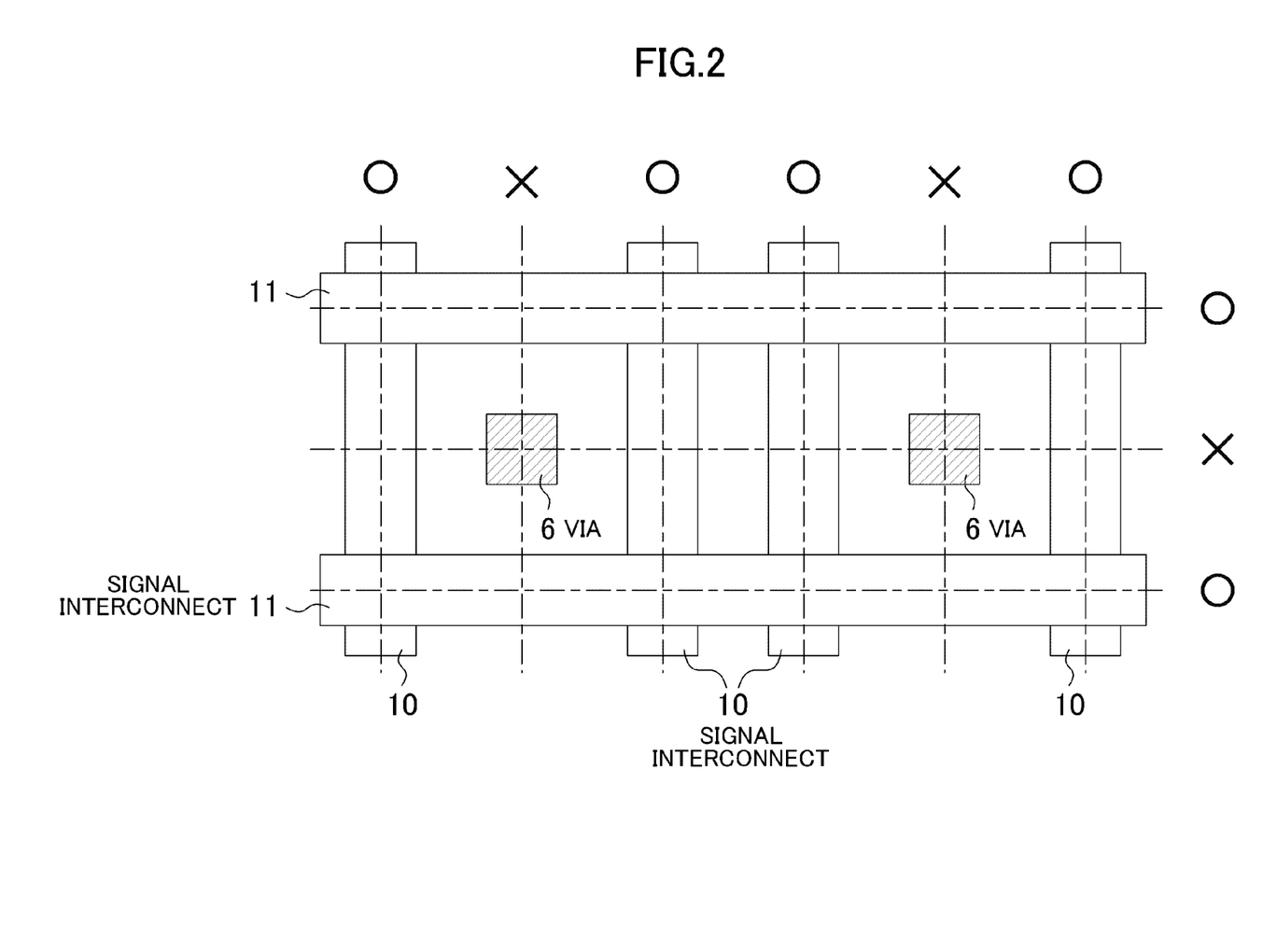
FIG. 2 is a top view of the power supply interconnect structure.

FIG. 1 is a cross-sectional view of a power supply interconnect structure of a semiconductor integrated circuit according to the present disclosure. FIG. 2 is a top view of the power supply interconnect structure and exemplifies a four-layered structure. In these figures, L1 denotes a first interconnect layer, and L4 denotes a fourth interconnect layer. L2 and L3 denote second and third intermediate interconnect layers located between the first and fourth interconnect layers L1 and L4.

Reference numeral 1 denotes a first power supply interconnect located in the first interconnect layer L1. Reference numeral 4 denotes a fourth power supply interconnect located in the fourth interconnect layer L4. When the first power supply interconnect 1 is connected to the fourth power supply interconnect 4 as a single power supply interconnect, a second interconnect 2 and a third interconnect 3 for connecting the power supply interconnect 1 to the power supply interconnect 4 are located in the second and third intermediate interconnect layers L2 and L3. The first to third vias 5, 6, and 7 are located in three insulating layers I1-I3. As can be seen from the top view shown in FIG. 2, the first to third vias 5-7 are single vias. The second and third interconnects 2 and 3 connected to the single vias have the same cross-sectional shapes, namely the single vias have the same horizontal and vertical length. That is, the single vias 5-7 are borderless vias not including wide pad portions shown in the conventional structure of FIG. 13.

As can be seen from FIG. 1, the first single via 5, the second interconnect 2, the second single via 6, the third interconnect 3, and the third single via 7 in a single vertical line are stacked in the same vertical line to form a single borderless stack via 8. The single borderless stack via 8 forms a connecting portion of the interconnects, which electrically connects the two power supply interconnects, i.e., the first and fourth power supply interconnects 1 and 4.

Using the single borderless stack via 8 as a single unit (pillar), five units are formed in FIG. 1. These units connects the first power supply interconnect 1 to the fourth power supply interconnect 4 to form an electrically connected single power supply interconnect. Note that, while in FIG. 1, five units are formed with equal spacing, there is no need to form all of them with equal spacing, and the spacing may be equal and unequal. While the unit includes the single vias 5-7 in the three insulating layers I1-I3, and the single interconnects 2 and 3 in the two intermediate interconnect layers L2 and L3, a stack (stacked) via may include, at least, single vias in two insulating layers and interconnects in the single intermediate interconnect layer.

In this embodiment, the single borderless stack via structure is employed. As can be seen from FIG. 3, which is an enlarged view of the circled portion in FIG. 1, the borderless vias 5-7 do not have the pad portions 61 shown in the conventional structure of FIG. 12. Thus, even when stack vias in respective units are located with spacing equal to that of a conventional structure in FIG. 12 and even when an interconnect separation rule is considered, single signal interconnects 10 are located in respective two interconnect tracks 12 provided between vias between the units. This structure improves interconnection characteristics as compared to the conventional structure shown in FIG. 12 where only the single signal interconnect 62 can be located.

As can be seen from the top view of FIG. 2, interconnect resources used for a signal interconnect are 4 vertical tracks and 2 horizontal tracks. Cleary, this structure provides excellent interconnection characteristics as compared to the conventional example shown in FIG. 13 where 0 vertical track and two horizontal tracks are used.

Figure 3:
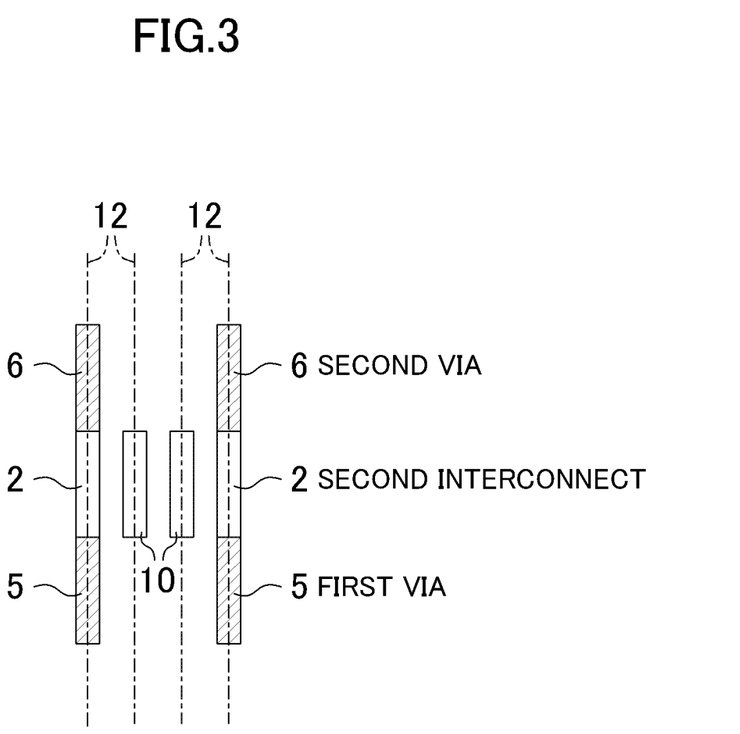
FIG. 3 is an enlarged view of a circled portion in the power supply interconnect structure of FIG. 1.

Furthermore, as can be seen from the top views of FIGS. 2 and 3, when the signal interconnect 10 adjacent to the interconnect 2 of the single borderless stack via 8 is located, the signal interconnect 10 is located on the interconnect track 12. Thus, a distance between the signal interconnect 10 and the interconnect 2 of the single borderless stack via 8 is equal to a distance between the signal interconnect 10 and another signal interconnect 10 adjacent to the signal interconnect 10. By contrast, as in FIG. 12 showing the conventional example, the signal interconnect 62 is located between the two interconnect tracks 60, not on an interconnect track 60, even when the single signal interconnect 62 is located between two multiple vias having the pad portion 61. In this embodiment, this allows the signal interconnects 10 around the single borderless stack via 8 on the interconnect tracks 12 to improve compatibility to the EDA tool.

In the top view of FIG. 2, two single vias 6 are located in a predetermined area of 6 vertical tracks and 3 horizontal tracks. The number of the vias is the same as that of two multiple (double) stack vias in the corresponding area shown in the conventional example of FIG. 13. Single vias and multiple vias have the same EM characteristics when the rate of EM is determined by a via portion and the numbers of vias are the same. Therefore, in the single borderless stack via structure according to this embodiment, EM characteristics are well maintained and disconnection at a via portion can be reduced.

Furthermore, in the top view of FIG. 2, the two single vias 6 are located in the predetermined area. However, in the single borderless stack via structure according to this embodiment, the single vias 6 may be located at any position as long as they are located in the predetermined area. For example, the both single vias 6 may be located so that only a single signal interconnect 10 is located between the single vias 6 or so that 3 or 4 signal interconnects 10 are located between the single vias 6.

Figure 4:
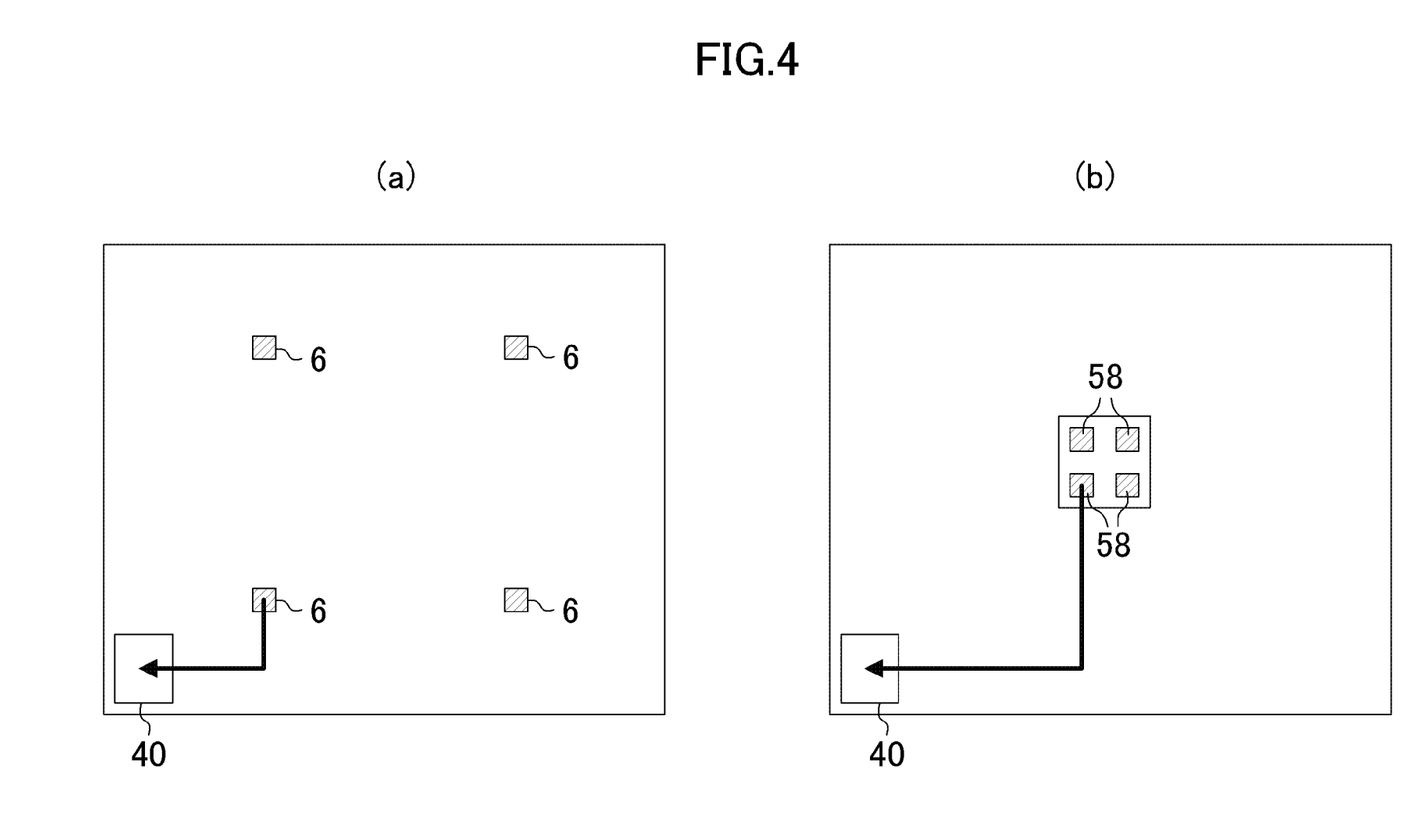
FIG. 4A illustrates that IR-DROP characteristics improve in the power supply interconnect structure.
FIG. 4B illustrates IR-DROP characteristics in a conventional power supply interconnect structure.

As described above, the position of the single borderless stack via 8 is highly flexible in this embodiment. Thus, for example, in this embodiment, as shown in FIG. 4A, four single vias 6 are widely spaced apart from each other. As a result, the power supply interconnect length to the target standard cell 40 which receives power supply can be shortened as compared to the case where four vias 58 forming a conventional multi-stack via are located close to each other, as shown in FIG. 4B. Therefore, in this embodiment, parasitic resistance and IR-DROP can be reduced depending on the short length.

Figure 5:
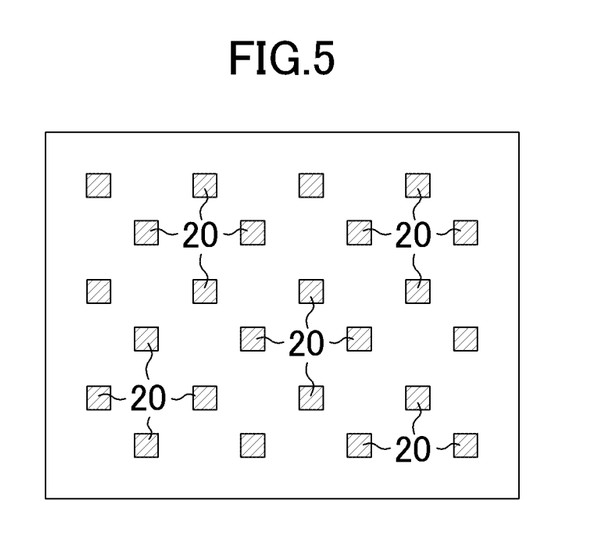
FIG. 5 is a top view of a semiconductor integrated circuit having the power supply interconnect structure and formed as a single chip.
Figure 6:
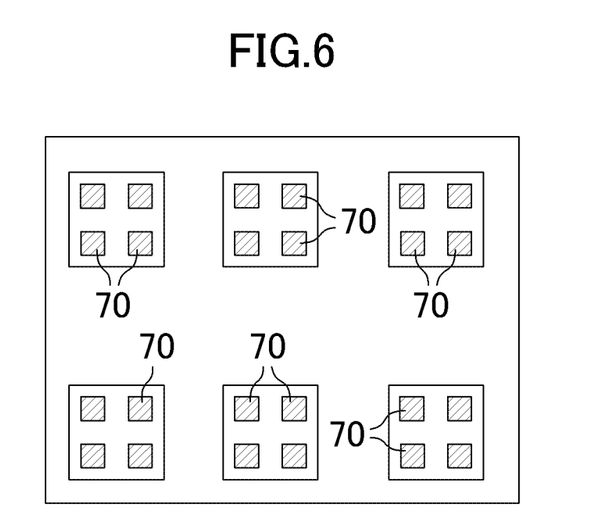
FIG. 6 is a top view of a semiconductor integrated circuit having a conventional power supply interconnect structure and formed as a single chip.

FIG. 5 is a schematic view of a semiconductor integrated circuit having the single borderless stack via structure according to this embodiment, and integrated in a single chip. The figure shows an example where all the vias are single borderless stack vias 20 and the number is 24. FIG. 6 illustrates a conventional semiconductor integrated circuit in which 6 multi-stack vias of four vias 70 are provided to form a chip. Similar to FIG. 5, the total number of the vias 70 is 24. As can be seen from comparison between FIGS. 5 and 6, the semiconductor integrated circuit of FIG. 5 having the single borderless stack via structure according to this embodiment. It is found that the vias 20 can be equally located over the entire surface of the chip as compared to FIG. 6, thereby shortening the power supply interconnect length to the target cell (not shown in FIGS. 5 and 6) receiving power supply and reduce IR-DROP.

Second Embodiment

Next, a second embodiment of the present disclosure will be described hereinafter with reference to the drawings.

Figure 7:
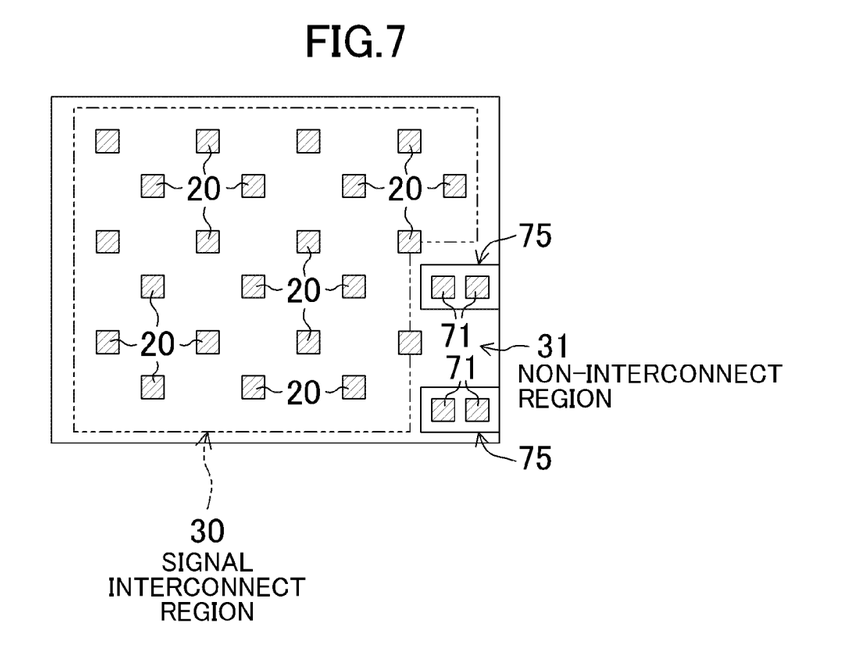
FIG. 7 is a top view of a semiconductor integrated circuit having a power supply interconnect structure according to a second embodiment.

FIG. 7 illustrates a power supply interconnect structure of a semiconductor integrated circuit according to this embodiment. The figure shows a semiconductor integrated circuit having two types of power supply interconnect structures of: a power supply interconnect structure in which single borderless stack vias 20 are scattered in a large number of predetermined places, and a power supply interconnect structure in which a plurality of multiple (double) stack vias 75 of a plurality of (two in the figure) vias 71 are located as another connecting portion of the interconnects. The detailed structure of the multi-stack via 75 has been shown in FIGS. 11-13 and described in the specification. Thus, the explanation thereof is omitted. As can be seen from FIG. 7, the distances between the plurality of single borderless stack vias 20 are clearly set longer than the distance between the two vias 71 of the multi-stack via 75.

Figure 8:
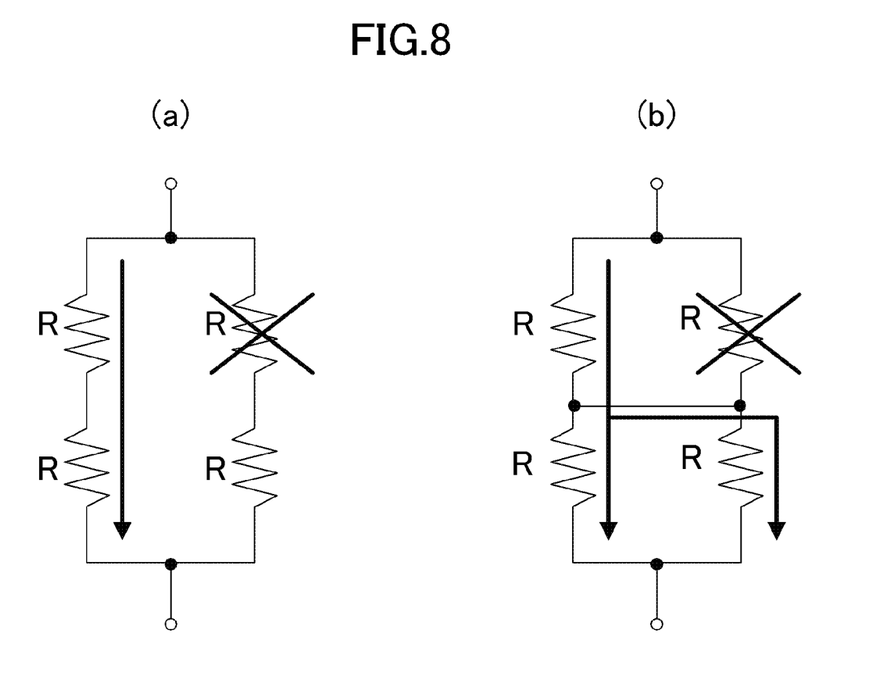
FIG. 8A illustrates a change in a resistance value when open faults occur in a single stack via structure included in the power supply interconnect structure.
FIG. 8B illustrates a change in a resistance value when open faults occur in a multi-stack via structure included in the power supply interconnect structure.

The region for locating the single borderless stack vias 20 is the signal interconnect region 30. The region for providing the multi-stack via 75 is a non-interconnect region 31 to which no signal is interconnected. This is because, when an open fault of a via occurs, a resistance value is greatly increased in the power supply interconnect structure with the single borderless stack vias 20. Examples are shown in FIGS. 8A and 8B. When three interconnect layers and two via layers are located in the single stack via structure shown in FIG. 8A, and open faults of a via occur, a current cannot flow to the unit. Where a resistance value of a single via is R, the combined resistance of two units is 2R. On the other hand, in the multiple (double) stack via structure shown in FIG. 8B, an interconnect having a pad portion between two vias having assurance function and the combined resistance is $\frac{3}{2}$R with small reduction. Therefore, even when a single power supply interconnect includes two types of a single borderless stack via structure and a multi-stack via structure, and open faults of a via occur, the combined resistance values of the power supply interconnect can be maintained low to reduce power supply interconnect defects. This enables an increase in the yield and an improvement in interconnection characteristics in the signal interconnect region 30.

Figure 9:
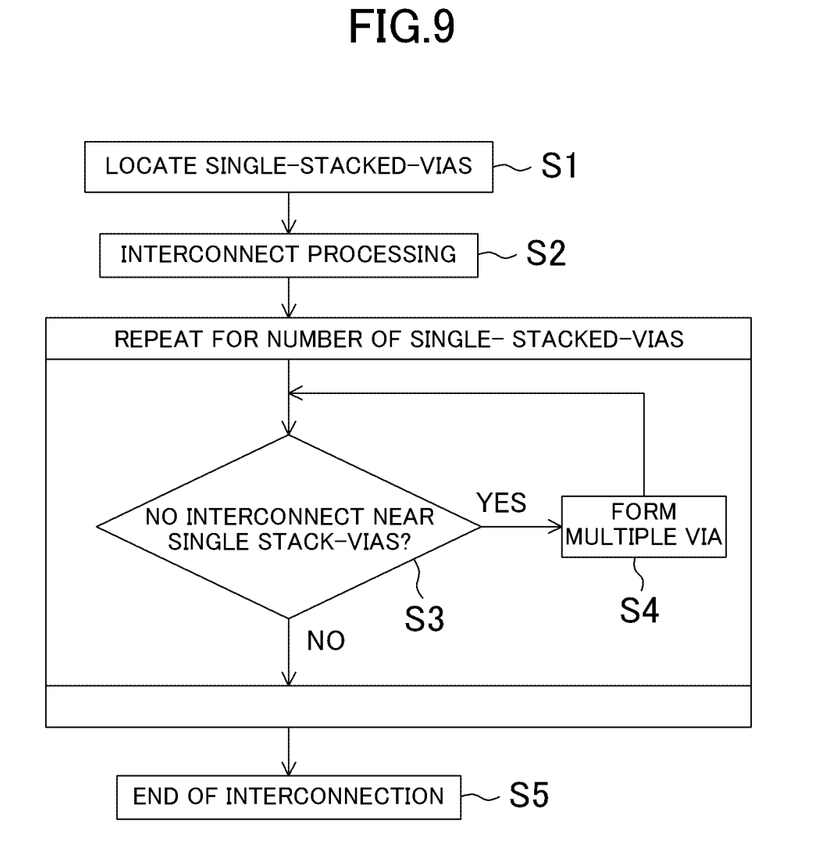
FIG. 9 is a flow chart illustrating formation of the power supply interconnect structure.

FIG. 9 illustrates a flow of the two types of power supply interconnect structure shown in FIG. 7. In step S1, a required number of single stack vias 20 in design is located in the signal interconnect region 30. Then, in step S2, layout processing of interconnects (i.e., interconnect processing) is performed in the signal interconnect region 30. After that, in step S3, existence of an interconnect near the located single stack vias 20 is determined. When no interconnect exists, the region is determined as a non-interconnect region and multi-stack vias 75 are located in step S4. The steps S3 and S4 for all the single stack vias 20 are repeated and the interconnection is completed in step S5, when the determination of existence of interconnects for all the single stack vias 20 are finished.

Third Embodiment

Next, a third embodiment of the present disclosure will be described hereinafter with reference to the drawings.

Figure 10:
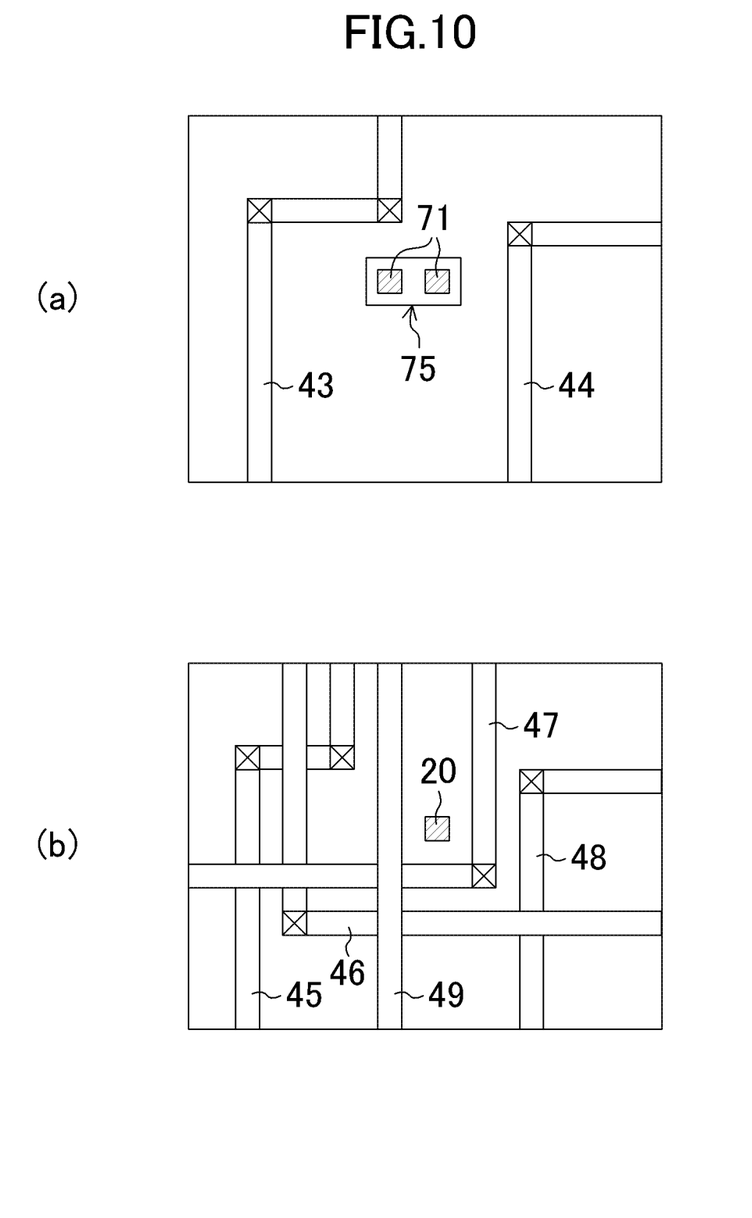
FIG. 10A illustrates a layout of an interconnect region with low signal interconnect density in a semiconductor integrated circuit having a power supply interconnect structure according to a third embodiment.
FIG. 10B illustrates a layout of an interconnect region with high signal interconnect density in the semiconductor integrated circuit.

FIG. 10 illustrates a power supply interconnect structure of a semiconductor integrated circuit according to this embodiment. In FIG. 7 illustrating the second embodiment, only the single borderless stack vias 20 are located in the signal interconnect region 30. In this embodiment, single borderless stack vias and multi-stack vias are located and divided in accordance with the interconnect density of a signal in the signal interconnect region 30.

Each of FIGS. 10A and 10B illustrates a part of a signal interconnect region. In FIG. 10A, the signal interconnects 43 and 44 are located in the signal interconnect region. FIG. 10A illustrates a signal interconnect region having predetermined low signal interconnect density, and having much space. In the interconnect, the multi-stack via 75 is located in the space. In the figure, the multi-stack via 75 includes two vias (double via) 71 as an example.

On the other hand, in the signal interconnect region shown in FIG. 10B, a large number of signal interconnects 45-49 are located with less space. The interconnect region has higher signal interconnect density than the signal interconnect density in the interconnect region shown in FIG. 10A. The single borderless stack vias 20 are located in the interconnect region with the high signal interconnect density.

Therefore, in this embodiment, the single borderless stack vias 20 are located in the interconnect region shown in FIG. 10B with high signal interconnect density, the large number of signal interconnects 45-49 are interconnected with high interconnection efficiency. For example, the signal interconnects 47 and 49 can be interconnected with small interconnect length without rounding around the proximity of the single borderless stack vias 20.

On the other hand, in the interconnect region shown in FIG. 10A with low signal interconnect density, the multi-stack vias 75 are provided. The number of the signal interconnects 43 and 44 is small and there is much space, there is no problem in selecting the interconnect path of the signal interconnects, thereby maintaining high interconnection efficiency.

Furthermore, the single borderless stack vias 20 and the multi-stack vias 75 are connected to power supply interconnects (i.e., the first and four power supply interconnects 1 and 4 shown in FIG. 1) in parallel. Thus, when open faults of a via occur, the resistance value of the power supply interconnect can be maintained low as described in the second embodiment, thereby increasing the yield of the chip.

As described above, the present disclosure includes a single borderless stack via as a connecting portion of interconnects electrically connecting interconnects of different interconnect layers. Thus, the present disclosure provides more excellent interconnection characteristics and a more largely reduced chip area than a multi-stack via of double or more via having a wide pad portion. This improves IR-DROP characteristics and reliably locate signal interconnects around a single borderless stack via on interconnect tracks, thereby improving compatibility to an EDA tool. Therefore, the present disclosure is useful as power supply interconnect structures of various semiconductor integrated circuits.

What is claimed is:

1. A power supply interconnect structure of a semiconductor integrated circuit comprising:
    power supply interconnects located in two different interconnect layers with at least one single intermediate interconnect layer interposed between the different interconnect layers; and
    a single borderless stack via electrically connecting the power supply interconnects located in the two interconnect layers to form a connecting portion of the interconnects,
    wherein the single borderless stack via forming the connecting portion of the interconnects includes:
        single vias located in respective two or more insulating layers located between the two interconnect layers, and
        an interconnect located in each of the at least one intermediate interconnect layer, and having a same cross-sectional shape as the single vias of the insulating layers, and
    the single vias of the insulating layers and the interconnect of the at least one intermediate interconnect layer are alternately layered in a same vertical line and electrically connected to form a unit.

2. The power supply interconnect structure of claim 1, wherein the unit of the single borderless stack via includes:
    single vias located in respective three insulating layers, and
    interconnects located in respective two intermediate interconnect layers interposed between the three insulating layers.

3. The power supply interconnect structure of claim 1, wherein multiples ones of the unit of the single borderless stack via are formed, and distances between the units are equal.

4. The power supply interconnect structure of claim 1, wherein multiple ones of the unit of the single borderless stack via are formed, and distances between the units are equal and unequal.

5. The power supply interconnect structure of claim 1, wherein multiple ones of the unit of the single borderless stack via are formed, and a first signal interconnect is located in a region between two adjacent ones of the units.

6. The power supply interconnect structure of claim 5, wherein a distance between the single borderless stack via and the first signal interconnect is equal to a distance between the first signal interconnect and a second signal interconnect adjacent to the first signal interconnect.

7. A power supply interconnect structure of a semiconductor integrated circuit comprising:
    power supply interconnects located in two different interconnect layers with at least one single intermediate interconnect layer interposed between the different interconnect layers; and
    a single borderless stack via electrically connecting the power supply interconnects located in the two interconnect layers to form a connecting portion of the interconnects, the single borderless stack via forming the connecting portion of the interconnects; and
    a multi-stack via configured to electrically connect the power supply interconnects located in the two interconnect layers to form another connecting portion of the interconnects.

8. The power supply interconnect structure of claim 7, wherein the multi-stack via includes:
    a plurality of vias located in respective two or more insulating layers located between the two interconnect layers, and
    an interconnect located in each of the at least one intermediate interconnect layer and having a pad portion to include the plurality of vias in the two or more insulating layers inside when viewed from above, and
    the plurality of vias of the insulating layers and the interconnect of the at least one intermediate interconnect layer are alternately layered in a same vertical line and electrically connected.

9. The power supply interconnect structure of claim 7, wherein the single borderless stack via forming the connecting portion of the interconnects is located in a signal interconnect region, and the multi-stack via forming the other connecting portion of the interconnects is located in a non-interconnect region to which a signal is not interconnected.

10. The power supply interconnect structure of claim 7, wherein
    the multi-stack via forming the other connecting portion of the interconnects is located in a region of the signal interconnect region having predetermined signal interconnect density, and
    the single borderless stack via forming the connecting portion of the interconnects is located in an interconnect region of the signal interconnect region, which has signal interconnect density higher than the predetermined density.

11. The power supply interconnect structure of claim 9, wherein multiple ones of the single borderless stack via are located in a plurality of places, and a distance between the multiple ones of the single borderless stack via is longer than a distance between the plurality of vias in a same insulating layer of the multi-stack via.

12. The power supply interconnect structure of claim 1, further comprising:
the single borderless stack via forming the connecting portion of the interconnects; and
a multi-stack via configured to electrically connect the power supply interconnects located in the two interconnect layers to form another connecting portion of the interconnects.

13. The power supply interconnect structure of claim 12, wherein the unit of the single borderless stack via includes:
single vias located in respective three insulating layers, and interconnects located in respective two intermediate interconnect layers interposed between the three insulating layers.

14. The power supply interconnect structure of claim 12, wherein multiples ones of the unit of the single borderless stack via are formed, and distances between the units are equal.

15. The power supply interconnect structure of claim 12, wherein multiple ones of the unit of the single borderless stack via are formed, and distances between the units are equal and unequal.

16. The power supply interconnect structure of claim 12, wherein multiple ones of the unit of the single borderless stack via are formed, and a first signal interconnect is located in a region between two adjacent ones of the units.

17. The power supply interconnect structure of claim 16, wherein a distance between the single borderless stack via and the first signal interconnect is equal to a distance between the first signal interconnect and a second signal interconnect adjacent to the first signal interconnect.

* * * * *